(12) United States Patent
Yu et al.

(10) Patent No.: US 8,941,239 B2
(45) Date of Patent: Jan. 27, 2015

(54) COPPER INTERCONNECT STRUCTURE AND METHOD FOR FORMING THE SAME

(75) Inventors: Chen-Hua Yu, Hsinchu (TW); Shau-Lin Shue, Hsinchu (TW); Hsiang-Huan Lee, Jhudong Township (TW); Ching-Fu Yeh, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/586,676

(22) Filed: Aug. 15, 2012

(65) Prior Publication Data
US 2013/0270702 A1 Oct. 17, 2013

Related U.S. Application Data

(60) Provisional application No. 61/624,154, filed on Apr. 13, 2012.

(51) Int. Cl.
*H01L 23/48* (2006.01)
*H01L 21/14* (2006.01)

(52) U.S. Cl.
USPC .... 257/751; 257/762; 257/774; 257/E21.584; 257/E23.16; 438/627; 438/628; 438/643; 438/653

(58) Field of Classification Search
USPC ............... 257/751, 762, E23.16, E21.584; 438/627, 628, 643, 653
See application file for complete search history.

(56) References Cited

U.S. PATENT DOCUMENTS

| 6,239,021 | B1 * | 5/2001 | Pramanick et al. | 438/627 |
| 2004/0175845 | A1 * | 9/2004 | Molla et al. | 438/3 |
| 2008/0128856 | A1 * | 6/2008 | Kwak | 257/532 |

* cited by examiner

*Primary Examiner* — Jasmine Clark
(74) *Attorney, Agent, or Firm* — Lowe Hauptman & Ham, LLP

(57) ABSTRACT

A copper interconnect structure in a semiconductor device including an opening formed in a dielectric layer of the semiconductor device, the opening having sidewalls and a bottom. A first barrier layer is conformally deposited on the sidewalls and the bottom of the opening. A first seed layer is conformally deposited on the first barrier layer. A second barrier layer is conformally deposited on the first seed layer. A second seed layer is conformally deposited on the second barrier layer and a conductive plug is deposited in the opening of the dielectric layer.

20 Claims, 2 Drawing Sheets

COPPER INTERCONNECT STRUCTURE AND METHOD FOR FORMING THE SAME

CROSS-REFERENCE TO RELATED APPLICATIONS

The present application claims priority of U.S. Provisional Patent Application Ser. No. 61/624,154, filed on Apr. 13, 2012, which is incorporated herein by reference in its entirety.

FIELD

The disclosure relates generally to the fabrication of semiconductor devices, and more particularly, to a copper interconnect structure and method for forming the same.

BACKGROUND

The use of copper as a conductive interconnect material is favored in semiconductor devices because of the high speed that copper provides. Copper interconnect structures are typically formed using damascene processing technology in which an opening is formed in a dielectric layer, copper is deposited within the opening, and then a polishing/planarization process is used to remove copper from over the dielectric layer, leaving copper inlaid within the opening. However, copper diffuses through dielectric materials, so the copper interconnect structures must be encapsulated by a diffusion barrier layer. Otherwise the diffused copper metal in the dielectric layer may result in current leakage between the interconnect structures. The diffusion barrier layer typically comprises a refractory material. Typical refractory materials used for the barrier layer include tantalum (Ta), tantalum nitride (TaN), titanium (Ti), and titanium nitride (TiN).

Studies have concluded that as the critical dimensions of integrated circuits (ICs) continue to shrink, seams or cracks may develop at a joinder between the copper and the diffusion barrier layer. These seams or cracks lead to the phenomena known as "electromigration" (EM) and "stress migration" that degrades the reliability of the copper interconnect structure.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
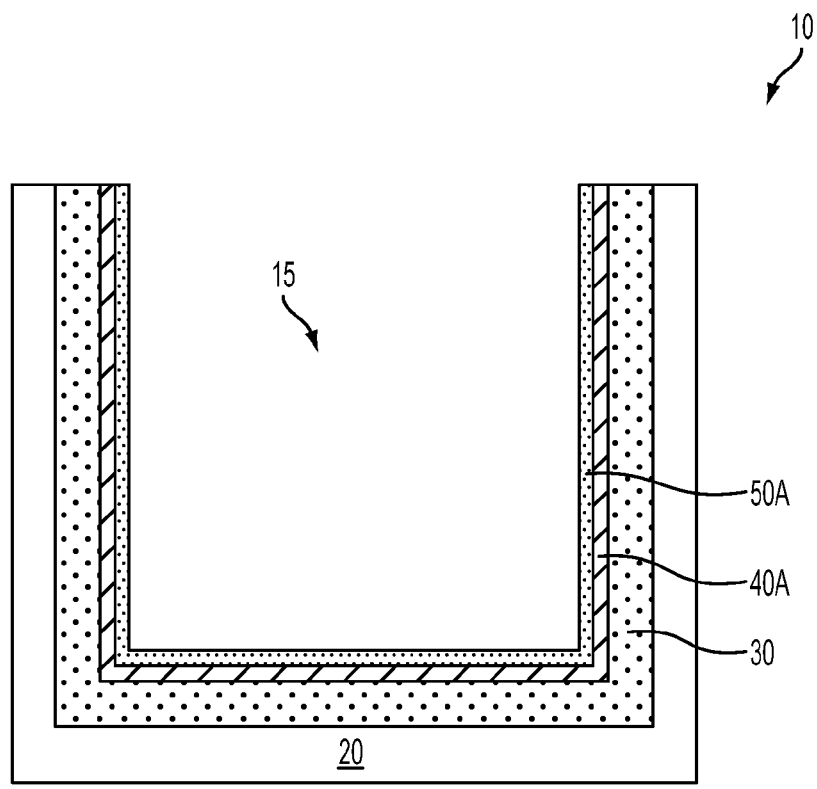
FIG. 1 is a cross-sectional view of a copper interconnect structure at an interim stage of fabrication, according to various aspects of the present disclosure.
Figure 2:
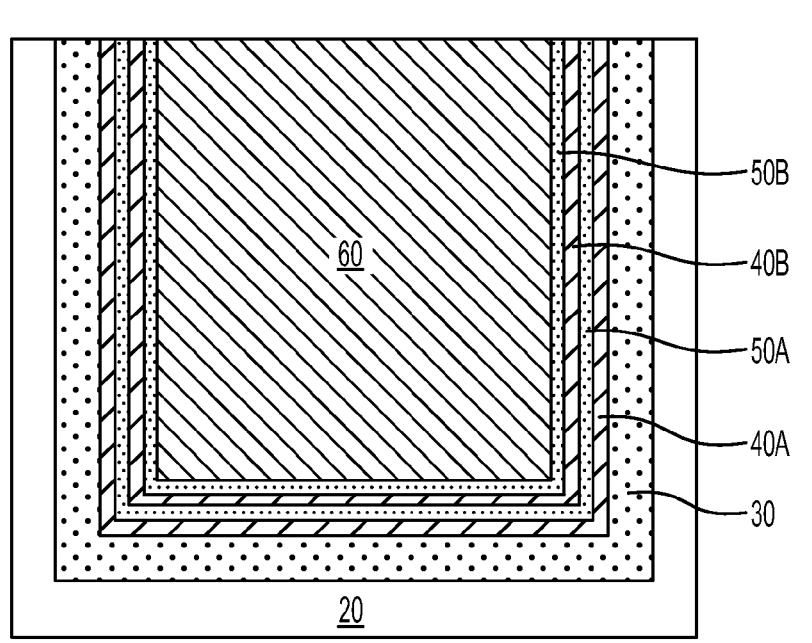
FIG. 2 is a cross-sectional view of the copper interconnect structure at a later stage of fabrication, in accordance with various aspects of the present disclosure.

FIGS. 1-2 are cross-sectional side views of a copper interconnect structure 10 at various fabrication stages according to aspects of the present disclosure. It is understood that FIGS. 1-2 have been simplified for a better understanding of the inventive concepts of the present disclosure.

Referring to FIG. 1, the copper interconnect structure 10 has an opening 15 formed in a dielectric layer 30 of a substrate 20. The substrate 20 may include one or more insulator, conductor, and/or semiconductor layers. For example, the substrate 20 may include an elementary semiconductor, such as crystal silicon, polycrystalline silicon, amorphous silicon, and/or germanium; a compound semiconductor, such as silicon carbide and/or gallium arsenic; or an alloy semiconductor, such as SiGe, GaAsP, AlInAs, AlGaAs, and/or GaInP. Further, the substrate 20 may include a bulk semiconductor, such as bulk silicon, and such a bulk semiconductor may include an epi silicon layer. The substrate 20 may also or alternatively include a semiconductor-on-insulator substrate, such as a silicon-on-insulator (SOI) substrate, or a thin-film transistor (TFT) substrate. The substrate 20 may also or alternatively include a multiple silicon structure or a multilayer compound semiconductor structure.

Dielectric layer 30 may be an inter-metal dielectric (IMD) and may comprise a dielectric material such as silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, silicon nitride, silicon oxy-nitride and/or other suitable materials. Dielectric layer 30 may comprise a low-k material having a dielectric constant, k, less than that of silicon dioxide, which is about 3.9. The dielectric material may be a porous material and may be a porous low-k material. The low-k dielectric material may be a chemical vapor deposition (CVD) low-k material, or a spin-on low-k material. In one exemplary embodiment, porous methylsilsesquioxane (MSQ) may be used as the low-k material. In some embodiments, the dielectric layer 30 comprises a plurality of dielectric layers, with or without an etch stop layer formed between adjacent dielectric layers.

The copper interconnect structure 10 includes the opening 15 formed in the dielectric layer 30. Opening 15 includes a bottom and sidewalls. Opening 15 may be a trench opening, a via opening, or various other openings into which a conductive layer is to be formed. For example, in an embodiment, the opening 15 comprises a long thin trench that is relatively straight. In some embodiments, opening 15 curves and digresses in bends or other patterns to form conductive lines within a metal layer. In other embodiments, the opening 15 forms a via, contact plug, or other interconnect structure electrically coupled to electrical devices or other conductive lines (not shown) formed in underlying layers.

The opening 15 may be formed by photolithography techniques. Generally, photolithography techniques involve applying a photoresist material (not shown) and exposing the photoresist material in accordance with a desired pattern. The photoresist material is then developed to remove a portion of the photoresist material, thereby exposing an underlying material in accordance with the desired pattern. The remaining photoresist material protects the underlying material from subsequent processing steps, such as etching, performed on the underlying material to form the opening 15 in the dielectric layer 30. After the opening 15 is formed, the remaining photoresist material, if any, may be removed. Other processes, such as electron beam lithography (EBL) or the like, may be utilized to form the opening 15.

The process described above described a single-damascene process for illustrative purposes only. Other processes, such as a dual-damascene process may be utilized in accordance with at least one embodiment of the present disclosure. For example, a dual-damascene process may be utilized to form a trench and a via through one or more layers of the dielectric layer 30.

Referring still to FIG. 1, a first barrier layer 40A is conformally deposited on the sidewalls and the bottom of opening 15. First barrier layer 40A prevents copper from a later deposited copper plug from diffusing into the surrounding dielectric layer 30; provides high electrical conductivity with low ohmic contact resistance; good adhesion between the substrate 20 and the barrier metal; and/or resistance to electromigration.

First barrier layer 40A may be deposited by physical vapor deposition (PVD), chemical vapor deposition (CVD), high-density plasma CVD (HDPCVD), atomic layer deposition (ALD), plasma-enhanced CVD (PECVD), or ionized PVD (I-PVD). First barrier layer 40A is formed of one or more layers of conductive materials, such as tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, other manganese-based materials, and/or other barrier materials. First barrier layer 40A may have a thickness from about 2 Angstroms to about 50 Angstroms. In at least one exemplary embodiment, first barrier layer 40A has a thickness from about 20 Angstroms to about 30 Angstroms.

A first seed layer 50A is conformally deposited on the first barrier layer 40A. First seed layer 50A may be deposited by physical vapor deposition (PVD), chemical vapor deposition (CVD), or atomic layer deposition (ALD). In some embodiments, first seed layer 50A comprising copper or copper alloys. In some embodiments, first seed layer 50A may be copper-doped onto the first barrier layer 40A by plasma bonding using Argon plasma, for example. First seed layer 50A is formed of one or more layers of conductive materials, such as copper or copper alloys. In some embodiments, first seed layer 50A may have a thickness from about 2 Angstroms to about 100 Angstroms. In at least one exemplary embodiment, first seed layer 50A has a thickness from about 40 Angstroms to about 70 Angstroms.

With reference now to FIG. 2, a second barrier layer 40B is conformally deposited on the first seed layer 50A. Second barrier layer 40B may be deposited by physical vapor deposition (PVD), chemical vapor deposition (CVD), high-density plasma CVD (HDPCVD), atomic layer deposition (ALD), plasma-enhanced CVD (PECVD), or ionized PVD (I-PVD). Second barrier layer 40B may be formed of one or more layers of conductive materials, such as tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, other manganese-based materials, and/or other barrier materials. In some embodiments, second barrier layer 40B may have a thickness from about 2 Angstroms to about 50 Angstroms. In at least one exemplary embodiment, second barrier layer 40B has a thickness from about 20 Angstroms to about 30 Angstroms.

A second seed layer 50B is conformally deposited on the second barrier layer 40B. Second seed layer 50B may be deposited by physical vapor deposition (PVD), chemical vapor deposition (CVD), or atomic layer deposition (ALD). In some embodiments, second seed layer 50B comprising copper or copper alloys. In some embodiments, second seed layer 50B may be copper-doped onto the second barrier layer 40B by plasma bonding using Argon plasma, for example. Second seed layer 50B is formed of one or more layers of conductive materials, such as copper or copper alloys and/or other seed materials. In some embodiments, second seed layer 50B may have a thickness from about 2 Angstroms to about 100 Angstroms. In at least one exemplary embodiment, second seed layer 50B has a thickness from about 40 Angstroms to about 70 Angstroms.

According to various aspects of the present disclosure, depositing a second set of barrier and seed layers, also known as Advanced Gradient Seed (AGS) helps reduce the occurrence of seams and cracks that may develop at a joinder between a copper layer and a diffusion barrier layer. These seams or cracks lead to the phenomena known as "electromigration" (EM) and "stress migration" that degrade the reliability of the copper interconnect structure. These problems are especially prevalent in copper interconnect structures of advanced node devices and so embodiments of the present invention address these issues.

In other embodiments, a third set of barrier and seed layers are deposited in opening 15 of the copper interconnect structure 10. In still other embodiments, a fourth set of barrier and seed layers are deposited in opening 15. In still yet other embodiments, a fifth set of barrier and seed layers are deposited in opening 15. A number s of sets of barrier and seed layers that can be deposited in opening 15 is based on the reduction of the occurrence of seams and cracks. For example, if four sets of barrier and seed layers are deposited in the opening 15 of the copper interconnect structure 10 to prevent the occurrence of seams and cracks, then the number s of sets is equal to 4; but if only two sets of barrier and seed layers are necessary to prevent the occurrence of seams and cracks, then s equals 2.

Following the deposition of second seed layer 50B, the opening 15 may then be filled with a conductive plug 60. In at least one example, the conductive plug 60 includes copper. The conductive material employed to form the conductive plug 60 may be formed in the opening 15 by various sputtering, evaporation, electroless-plating, electroplating and/or other deposition processes. Additional processes may be performed to complete the interconnect structure of the semiconductor device 10 such as, for example planarizing the top surface of the conductive plug 60 with a chemical-mechanical polishing (CMP) system and/or depositing a layer of dielectric or passivation material on the conductive plug 60.

Figure 3:
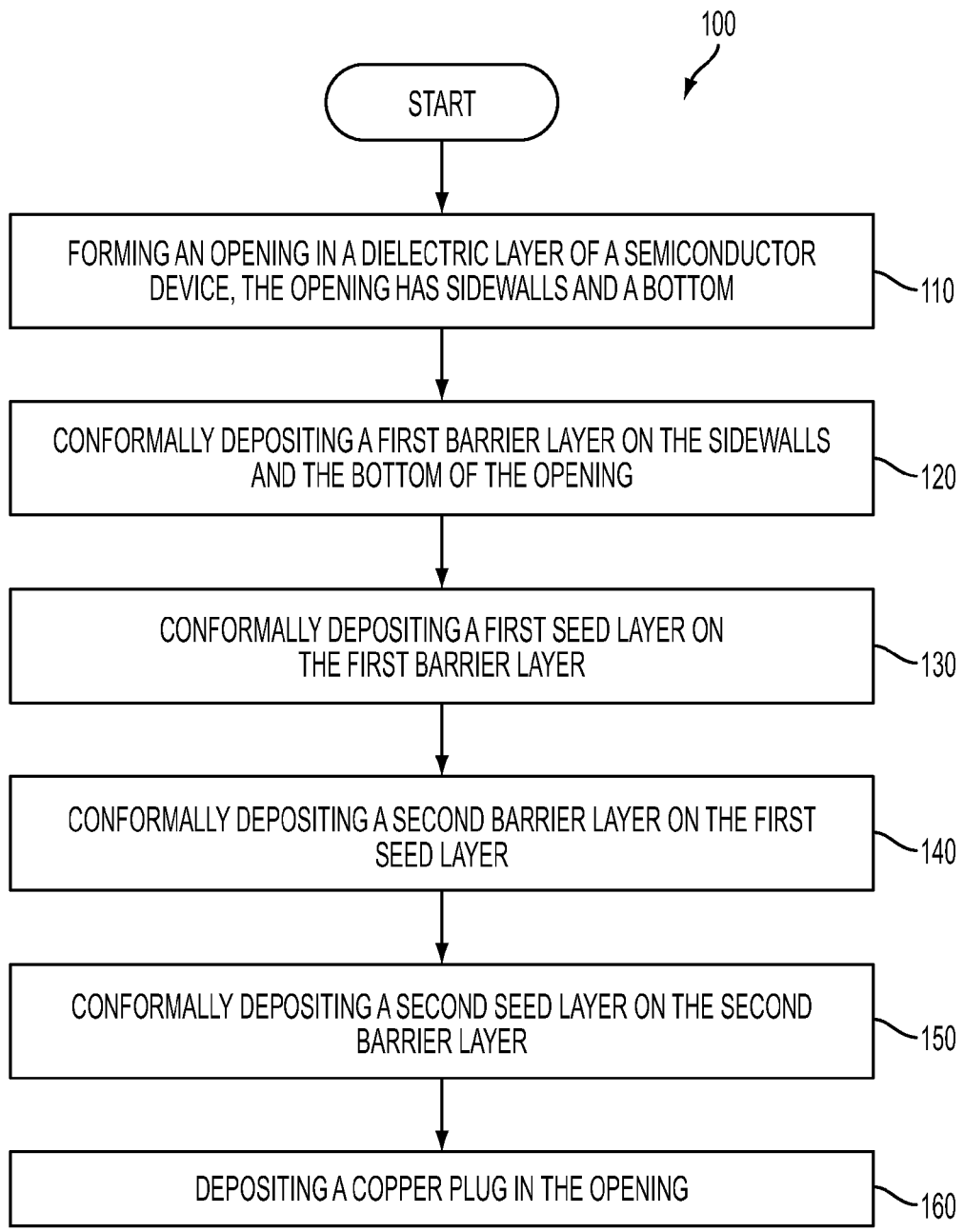
FIG. 3 is a flowchart illustrating a method for fabricating a copper interconnect structure, according to various aspects of the present disclosure.

Illustrated in FIG. 3 is a flowchart of a method 100 for forming a copper interconnect structure according to various aspects of the present disclosure. Referring to FIG. 3, the method includes block 110, in which an opening is formed in a dielectric layer of a semiconductor device. The opening has sidewalls and a bottom. The method 100 includes block 120, in which a first barrier layer is conformally deposited on the sidewalls and the bottom of the opening. The method 100 includes block 130, in which a first seed layer is conformally deposited on the first barrier layer. The method 100 includes block 140, in which a second barrier layer is conformally deposited on the first seed layer. The method 100 includes block 150, in which a second seed layer is conformally deposited on the second barrier layer. The method 100 includes block 160, in which a conductive plug is deposited in the opening.

It is understood that additional processes may be performed before, during, or after the blocks 110-160 of FIG. 3 to complete the fabrication of the semiconductor device, but these additional processes are not discussed herein in detail for the sake of simplicity. For example, in one embodiment, a third barrier layer (not shown) may be conformally deposited on the second seed layer and a third seed layer (not shown) may be conformally deposited on the third barrier layer. In another embodiment, a fourth barrier layer (not shown) may be conformally deposited on the third seed layer and a fourth seed layer (not shown) may be conformally deposited on the fourth barrier layer. In fact, according to aspects of the present disclosure and as discussed above, s sets of barrier and a seed layers may be deposited in the opening of the copper interconnect structure. One of ordinary skill in the art understands that a number s of sets of barrier and seed layers that need to be deposited in the opening of the interconnect structure to prevent electromigration and stress migration that degrade the reliability of the copper interconnect structure may be deposited.

Variations may be utilized for performing the above steps. In at least one example, instead of copper, the conductive plug 60 may include a variety of other materials, such as copper alloy, refractory metals, $TiSi_2$, $CoSi_2$, NiSi, PtSi, W, $WSi_2$, metal silicide, TiN, TaN, Al, AlCu, aluminum, aluminum alloy, tungsten, and/or other suitable materials. In at least a second example, the semiconductor device 10 can include a connection structure that is utilized for connecting interconnect layers, an interconnect layer and a substrate, an interconnect layer and a gate, an active region and a gate, an active region and an interconnect layer, or serve other connection purposes. In at least a third example, the semiconductor device 10 can include a connection structure that is utilized to connect different semiconductor devices, such as a drain region of a first device and the gate of a second device, or a source region of a first device and the gate of a second device.

Embodiments of the present disclosure provides a copper interconnect structure 10 having robust reliability, low copper line resistance, better adhesion between copper and the barrier layer(s) and reduces the phenomena of electromigration (EM) and/or stress migration effects that may degrade the reliability of the copper interconnect structure. The method of the present disclosure can be applied to other applications where copper diffusion across a copper to dielectric interface is a concern.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A copper interconnect structure in a semiconductor device, comprising:
    an opening formed in a dielectric layer of the semiconductor device, the opening having sidewalls and a bottom;
    a first barrier layer deposited on the sidewalls and the bottom of the opening;
    a first seed layer deposited on the first barrier layer within the opening;
    a second barrier layer deposited directly on and entirely covering the first seed layer within the opening; and
    a second seed layer deposited on the second barrier layer, wherein at least one of the first seed layer is doped onto the first barrier layer or the second seed layer is doped onto the second barrier layer.

2. The copper interconnect structure of claim 1, wherein the first barrier layer has a thickness from about 2 Angstroms to about 50 Angstroms and the second barrier layer has a thickness from about 2 Angstroms to about 50 Angstroms.

3. The copper interconnect structure of claim 1, wherein the first seed layer has a thickness from about 2 Angstrom to about 100 Angstroms and the second seed layer has a thickness from about 2 Angstroms to about 100 Angstroms.

4. The copper interconnect structure of claim 1, wherein the first barrier layer and the second barrier layer independently comprise tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, or other manganese-based materials.

5. The copper interconnect structure of claim 1, wherein the first seed layer and the second seed layer comprise copper or copper alloys and are deposited by physical vapor deposition (PVD), chemical vapor deposition (CVD), atomic layer deposition (ALD), plasma-enhanced CVD (PE-CVD), or plasma-enhanced ALD (PE-ALD).

6. The copper interconnect structure of claim 1, wherein the copper interconnect structure is a single damascene structure.

7. The copper interconnect structure of claim 1, wherein the copper interconnect structure is a dual damascene structure.

8. The copper interconnect structure of claim 1, further comprising a conductive plug deposited in the opening, wherein the second barrier layer and the second seed layer are configured to prevent seams and cracks at a joinder between the conductive plug and one or more of the first barrier layer and the second barrier layer.

9. The copper interconnect structure of claim 1, further comprising:
    a third barrier layer deposited on the second seed layer; and
    a third seed layer deposited on the third barrier layer.

10. The copper interconnect structure of claim 9, further comprising:
    a fourth barrier layer deposited on the third seed layer; and
    a fourth seed layer deposited on the fourth barrier layer.

11. A method for forming a copper interconnect structure in a semiconductor device, the method comprising:
    forming an opening in a dielectric layer of the semiconductor device, the opening having sidewalls and a bottom;
    depositing a first barrier layer on the sidewalls and the bottom of the opening;
    depositing a first seed layer on the first barrier layer within the opening;
    depositing a second barrier layer on and entirely covering the first seed layer within the opening; and
    depositing a second seed layer on the second barrier layer, wherein at least one of the first seed layer is doped onto the first barrier layer or the second seed layer is doped onto the second barrier layer.

12. The method of claim 11, wherein the first barrier layer has a thickness from about 2 Angstroms to about 50 Angstroms and the second barrier layer has a thickness from about 2 Angstroms to about 50 Angstroms.

13. The method of claim 11, wherein the first seed layer has a thickness from about 2 Angstroms to about 100 Angstroms and the second seed layer has a thickness from about 2 Angstroms to about 100 Angstroms.

14. The method of claim 11, wherein the first barrier layer and the second barrier layer independently comprise tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, or other manganese-based materials, and are deposited by physical vapor deposition (PVD), chemical vapor deposition (CVD), atomic layer deposition (ALD), plasma-enhanced CVD (PE-CVD), or plasma-enhanced ALD (PE-ALD).

15. The method of claim 11, wherein the first seed layer and the second seed layer comprise copper or copper alloys and are deposited by physical vapor deposition (PVD), chemical vapor deposition (CVD), atomic layer deposition (ALD), plasma-enhanced CVD (PE-CVD), or plasma-enhanced ALD (PE-ALD).

16. The method of claim 11, wherein the copper interconnect structure is a single damascene structure.

17. The method of claim 11, wherein the copper interconnect structure is a dual damascene structure.

18. The method of claim 11, further comprising depositing a conductive plug in the opening,
   wherein the second barrier layer and the second seed layer are configured to prevent seams and cracks at a joinder between the conductive plug and one or more of the first barrier layer and the second barrier layer.

19. The method of claim 11, further comprising:
   depositing a third barrier layer on the second seed layer; and
   depositing a third seed layer on the third barrier layer.

20. The method of claim 19, further comprising:
   depositing a fourth barrier layer on the third seed layer; and
   depositing a fourth seed layer on the fourth barrier layer.

\* \* \* \* \*